(12) United States Patent
Inaba et al.

(10) Patent No.: US 7,933,325 B2
(45) Date of Patent: Apr. 26, 2011

(54) ANTENNA DRIVING APPARATUS

(75) Inventors: Hisashi Inaba, Kariya (JP); Rikuo Hatano, Toyota (JP); Eiji Mushiake, Chita-gun (JP); Masahiro Hagimoto, Anjo (JP)

(73) Assignee: Aisin Seiki Kabushiki Kaisha, Kariya-Shi, Aichi-Ken (JP)

( * ) Notice: Subject to any disclaimer, the term of this patent is extended or adjusted under 35 U.S.C. 154(b) by 901 days.

(21) Appl. No.: 11/663,738

(22) PCT Filed: Sep. 28, 2005

(86) PCT No.: PCT/JP2005/017811
§ 371 (c)(1),
(2), (4) Date: Mar. 26, 2007

(87) PCT Pub. No.: WO2006/035799
PCT Pub. Date: Apr. 6, 2006

(65) Prior Publication Data
US 2008/0049828 A1      Feb. 28, 2008

(30) Foreign Application Priority Data
Sep. 28, 2004   (JP) .................................. 2004-282502

(51) Int. Cl.
H03K 7/08        (2006.01)
H03K 9/08        (2006.01)
H04J 9/00        (2006.01)

(52) U.S. Cl. .......... 375/238; 327/31; 327/172; 329/312; 370/205

(58) Field of Classification Search .................... 327/31, 327/172; 329/312; 370/205; 375/238
See application file for complete search history.

(56) References Cited

U.S. PATENT DOCUMENTS

| 6,014,058 | A * | 1/2000 | Iga ................................. 330/279 |
| 6,768,413 | B1 | 7/2004 | Kemmann et al. |
| 6,812,823 | B2 | 11/2004 | Inaba et al. |
| 2001/0010489 | A1 * | 8/2001 | Baudard ...................... 340/5.72 |

(Continued)

FOREIGN PATENT DOCUMENTS

JP        2-103934 U        8/1990

(Continued)

OTHER PUBLICATIONS

Official Action issued by the Japanese Patent Office in corresponding JP Patent Appln. No. 2004-282502, Jan. 8, 2008.

(Continued)

*Primary Examiner* — David C Payne
*Assistant Examiner* — Erin M File
(74) *Attorney, Agent, or Firm* — Buchanan Ingersoll & Rooney PC (57) ABSTRACT

A transmitter portion 14 includes a control circuit 32, a driver circuit 33, and a wave detector circuit 35. The control circuit 32 generates control signals Vp, Vn based on a pulsed transmission signal So. The driver circuit 33, which is supplied with a battery voltage Vb, generates an output signal Sa to be sent to an antenna 13 based on the control signals Vp, Vn. The wave detector circuit 35 outputs a detection signal Sk having a voltage proportional to the level of the output signal Sa (transmission power level). The control circuit 32 changes the pulse widths of the control signals Vp, Vn based on the voltage level of the detection signal Sk. As a result, electric power consumption is reduced and enlargement of an apparatus is suppressed while maintaining the transmission power level constant.

10 Claims, 6 Drawing Sheets

U.S. PATENT DOCUMENTS

| | | | |
|---|---|---|---|
| 2002/0185995 A1* | 12/2002 | Mitamura et al. | 323/282 |
| 2004/0160126 A1* | 8/2004 | Aoki et al. | 307/10.2 |
| 2005/0253720 A1* | 11/2005 | Oakes et al. | 340/572.1 |
| 2006/0078038 A1* | 4/2006 | McCorkle | 375/130 |
| 2006/0140253 A1* | 6/2006 | Maeki et al. | 375/146 |

FOREIGN PATENT DOCUMENTS

| | | |
|---|---|---|
| JP | 05-106376 A | 4/1993 |
| JP | 6-104776 A | 4/1994 |
| JP | 10-166966 A | 6/1998 |
| JP | 10-173454 A | 6/1998 |
| JP | 2001-520337 A | 10/2001 |
| JP | 2001-308664 A | 11/2001 |
| JP | 2002-261632 A | 9/2002 |
| JP | 2003-087069 A | 3/2003 |

OTHER PUBLICATIONS

International Search Report for PCT/JP2005/017811 dated Dec. 13, 2005.

Official Action issued by the Japanese Patent Office in corresponding JP Patent Appln. No. 2004-282502, Apr. 1, 2008.

English Translation of the International Preliminary Report on Patentability and Written Opinion issued in corresponding International Application No. PCT/JP2005/017811, May 10, 2007, International Bureau of WIPO, Geneva, CH.

* cited by examiner

ANTENNA DRIVING APPARATUS

FIELD OF THE INVENTION

The present invention relates to an antenna driving apparatus.

BACKGROUND OF THE INVENTION

Patent Document 1 discloses an electronic key system that locks and unlocks a vehicle door in response to signals from a portable device held by a user. The system includes the portable device held by a user and a control apparatus mounted on a vehicle. The portable device includes first receiving means, which receives a transmission request signal, and first transmitting means, which transmits a response signal in response to the transmission request signal. The control apparatus includes second transmitting means, which transmits the transmission request signal at predetermined time intervals, and second receiving means, which receives the response signal. When receiving the response signal from the portable device, the control apparatus outputs a signal for unlocking the vehicle door, and when not receiving the response signal, the control apparatus outputs a signal for locking the vehicle door after a predetermined time has elapsed from when the transmission request signal is transmitted.

In the above-mentioned system, a receivable range in which the portable device can receive the transmission request signal, that is, a range in which the portable device can transmit the response signal is determined by the power level (transmission output level) of the transmission request signal to be transmitted from the second transmitting means, and has an influence on the convenience of the system. That is, if the receivable range of the transmission request signal is too narrow, the vehicle door might not be unlocked even when the user approaches the vehicle to get on the vehicle. In contrast, if the receivable range of the transmission request signal is too wide, the vehicle door might be unlocked even when the user is not intending to get on the vehicle. Therefore, the receivable range of the transmission request signal, that is, the transmission output level needs to be maintained appropriate and constant.

The control apparatus operates in accordance with voltage supplied from a battery mounted on the vehicle. The voltage of the battery fluctuates depending on the condition of use and the ambient temperature of the battery. If the voltage supplied from the battery to the control apparatus fluctuates, the output level of the transmission request signal, that is, the receivable range of the transmission request signal fluctuates. Measures for maintaining the voltage supplied to the control apparatus include a measure in which a stabilized power supply circuit, which reduces the voltage of the battery, is provided between the battery and the control apparatus, and the control apparatus is operated by the output voltage of the power supply circuit. In addition, as another measure, Patent Document 2 discloses a measure in which an automatic power control circuit is used. The circuit includes a switching power supply that controls the gain of an amplifier, which amplifies the transmission request signal, in accordance with the transmission output level.

However, since the stabilized power supply circuit and the switching power supply are constantly operated, the battery voltage is reduced due to consumption of power by the stabilized power supply circuit and the switching power supply. Furthermore, the stabilized power supply circuit converts the battery voltage to a lower voltage. When using a dropper regulator for conversion of the voltage, energy loss such as heat generation occurs, and the battery voltage is not efficiently used. When the stabilized power supply circuit is configured by a switching regulator, the configuration of the circuit of the control apparatus is complicated, which enlarges the control apparatus. Since there is a restriction in the size of the control apparatus mounted on the vehicle, the enlarged control apparatus might not satisfy the restriction.

Patent Document 1: Japanese Laid-Open Patent Publication No. 5-106376

Patent Document 2: Japanese Laid-Open Patent Publication No. 2003-87069

SUMMARY OF THE INVENTION

Accordingly, it is an objective of the present invention to provide an antenna driving apparatus that reduces electric power consumption and has a reduced size.

To achieve the above objective, the present invention provides an antenna driving apparatus operated by power supplied from a power source and generates a signal to be transmitted via an antenna. The antenna driving apparatus includes a control circuit and an amplifier circuit. The control circuit generates a pulsed control signal based on a pulsed transmission signal. The amplifier circuit is supplied with power from the power source and generates an output signal to be sent to the antenna based on the control signal. The control circuit changes the pulse width of the control signal based on the level of the output signal or the voltage of the power source.

According to the present invention, the pulsed control signal for controlling the amplifier circuit, which is supplied with power from the power source, is generated based on the pulsed transmission signal. Based on the level of the output signal from the amplifier circuit or the voltage of the power source, the pulse width of the control signal is changed. As a result, without reducing the voltage of the power source, the antenna is driven at a constant transmission power level, and the electric power consumption is reduced. Unlike the conventional technique, the apparatus is prevented from being enlarged since a circuit that reduces the power supply voltage is unnecessary.

According to one aspect of the present invention, the antenna driving apparatus includes a detection circuit, which detects the level of the output signal of the amplifier circuit. The control circuit changes the pulse width of the control signal in accordance with the level of a detection signal output from the detection circuit.

In this case, changing the pulse width of the control signal in accordance with the level of the detection signal output from the detector circuit stabilizes the level of the output signal from the amplifier circuit.

In the present invention, the control circuit may compare the voltage of the detection signal with a predetermined reference voltage and control the pulse width of the control signal in accordance with the comparison result such that the voltage of the detection signal agrees with the reference voltage.

In this case, the level of the output signal from the amplifier circuit is maintained constant by controlling the pulse width of the control signal such that the voltage of the detection signal agrees with the reference voltage.

In the present invention, the reference voltage may be variable. In this case, the reference voltage is varied as required to stabilize the level of the output signal from the amplifier circuit at a desired level.

In the present invention, the control circuit may include a pulse generating circuit, which generates a pulse signal having a pulse width corresponding to the level of the detection signal, and a control signal generating circuit, which generates the control signal from the pulse signal and the transmission signal.

In a further aspect of the present invention, the control circuit compares the voltage of the power source with a predetermined reference voltage and controls the pulse width of the control signal in accordance with the comparison result such that the voltage of the output signal of the amplifier circuit agrees with the reference voltage.

In this case, since the detection circuit for detecting the level of the output signal of the amplifier circuit is unnecessary, further miniaturization is achieved.

In the present invention, the control circuit may include a pulse generating circuit, which generates a pulse signal having a pulse width corresponding to the voltage of the power source, and a control signal generating circuit, which generates the control signal from the pulse signal and the transmission signal.

According to one aspect of the antenna driving apparatus of the present invention, the antenna is accommodated in a handle arranged on the outside of a vehicle door. As described above, the antenna driving apparatus of the present invention is used as a vehicle communication device in a suitable manner.

DETAILED DESCRIPTION OF THE PREFERRED EMBODIMENTS

First Embodiment

A first embodiment of the present invention will now be described with reference to the drawings.

Figure 2:
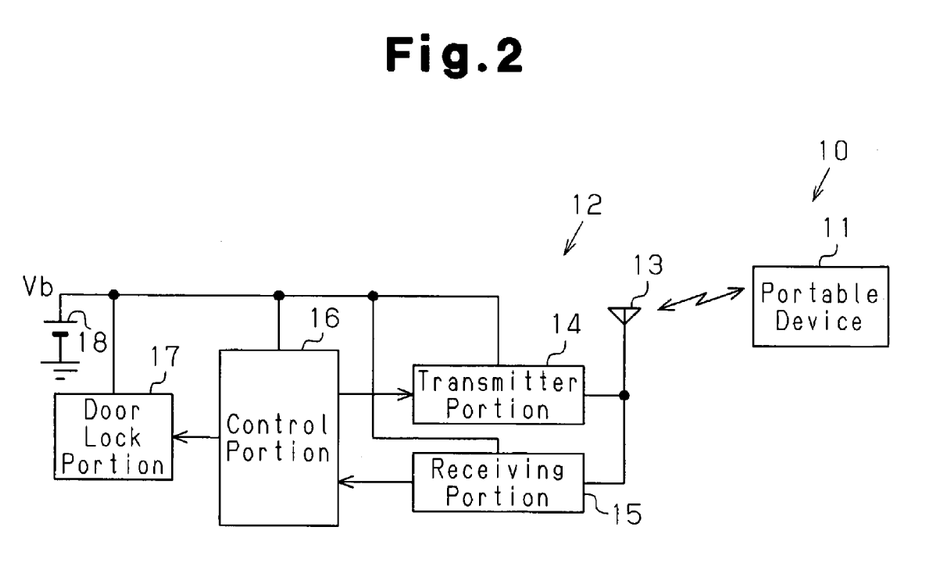
FIG. 2 is a schematic diagram illustrating an electronic key system.

As shown in FIG. 2, an electronic key system 10 includes a portable device 11 held by a user of a vehicle, for example, a driver, and a vehicle communication device (vehicle-mounted device) 12 provided on the vehicle. The system 10 selectively locks and unlocks a vehicle door 21 (see FIG. 6) to and from a door lock portion (door lock mechanism) 17 as the user holding the portable device 11 approaches or moves away from the vehicle. The system 10 eliminates the need for the user to actuate the door lock portion 17 by manipulating a key. That is, in the system 10, the portable device 11 and the vehicle communication device 12 communicate with each other, and the door lock portion 17 locks and unlocks the vehicle door 21 in accordance with the user's intension. The user's intension refers to a situation where the user places a hand on a door handle (an outside handle 22 shown in FIG. 6) provided on the vehicle door 21 to open the vehicle door 21. The door lock portion 17 is provided on or near the vehicle door 21.

Figure 6:
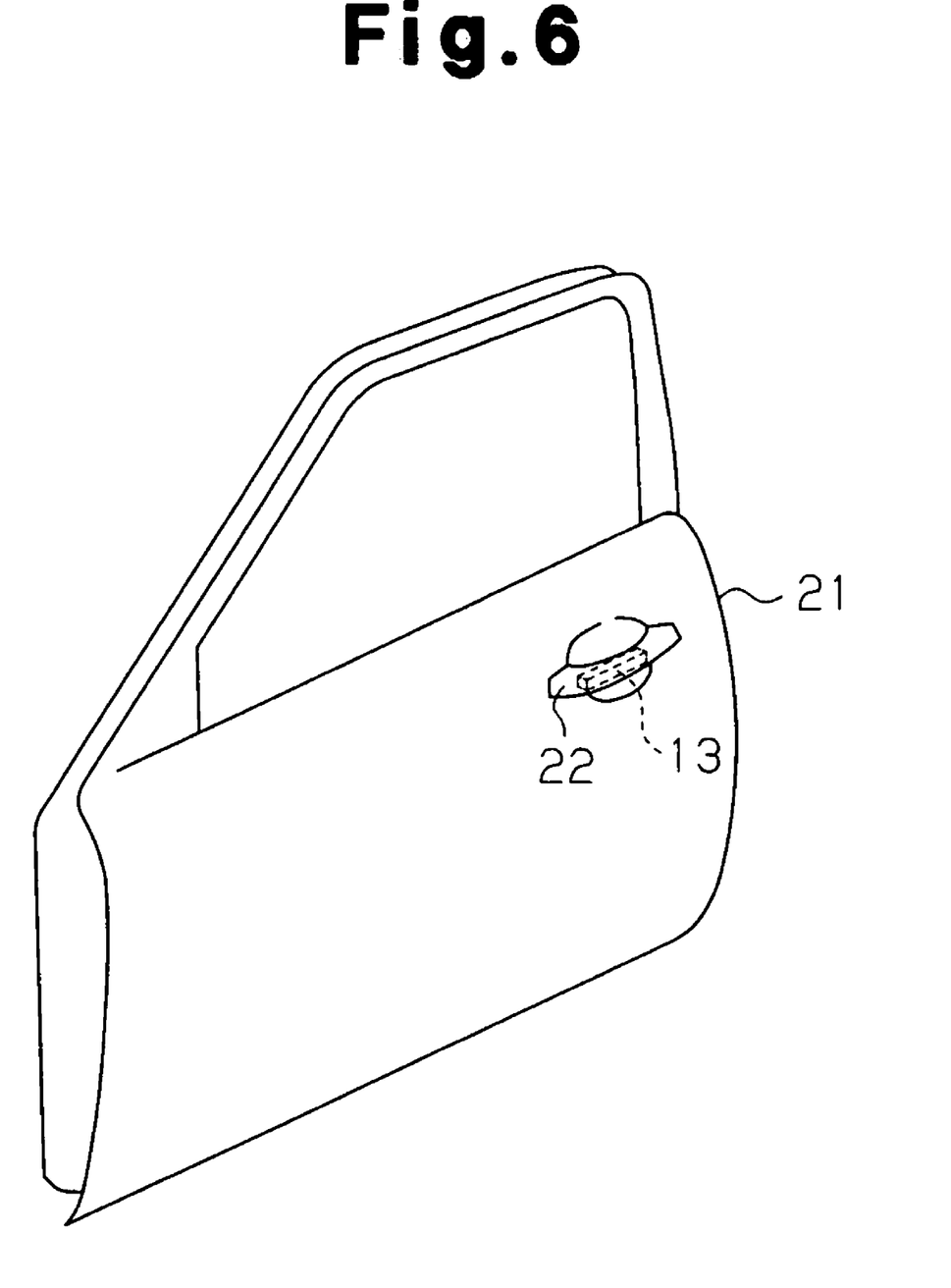
FIG. 6 is an outline view illustrating a vehicle door.

The vehicle communication device 12 includes an antenna 13, which communicates with the portable device 11, a transmitter portion 14, which generates signals transmitted to the portable device 11, a receiving portion 15, which receives signals transmitted from the portable device 11 via the antenna 13, and a control portion 16, which controls the transmitter portion 14 and the receiving portion 15. The antenna 13 is provided in the outside handle 22 as shown in FIG. 6. The outside handle 22 is grasped by the user when opening or closing the vehicle door 21.

The antenna 13 is connected to the transmitter portion 14 and the receiving portion 15, and the transmitter portion 14 and the receiving portion 15 are connected to the control portion 16. The control portion 16 is connected to a controlled portion (controlled object), which is the door lock portion 17 in the first embodiment. The transmitter portion 14, the receiving portion 15, the control portion 16, and the door lock portion 17 are operated by power supplied from a battery 18 mounted on the vehicle.

The control portion 16 causes the transmitter portion 14 to transmit a transmission request signal (hereinafter, simply referred to a request signal) via the antenna 13 to the outside of the vehicle at predetermined time intervals. Since the antenna 13 is arranged in the outside handle 22 located outside of the vehicle door 21 as shown in FIG. 6, the antenna 13 transmits the request signal to the outside of the vehicle in a suitable manner without being affected by a vehicle body.

The portable device 11 has an antenna, which is not shown, and transmits an ID information signal (a response signal) including a predetermined code via the antenna in response to the request signal received via the antenna.

The ID information signal transmitted from the portable device 11 is received by the antenna 13. The receiving portion 15 demodulates the ID information signal received by the antenna 13 and outputs it to the control portion 16.

The control portion 16 stores a verification code in advance, and compares the verification code with a code (reception code) included in the ID information signal. Then, when the verification code agrees with the reception code, the control portion 16 outputs a first control signal (unlock signal) to the door lock portion 17. Based on the first control signal, the door lock portion 17 unlocks the vehicle door 21.

If the ID information signal is not received in response to the transmission of the request signal, or the verification code does not agree with the reception code although the ID information signal is received, the control portion 16 outputs a second control signal (lock signal) to the door lock portion 17 after a predetermined time has elapsed from when the request signal is transmitted. The door lock portion 17 locks the vehicle door 21 based on the second control signal.

Figure 1:
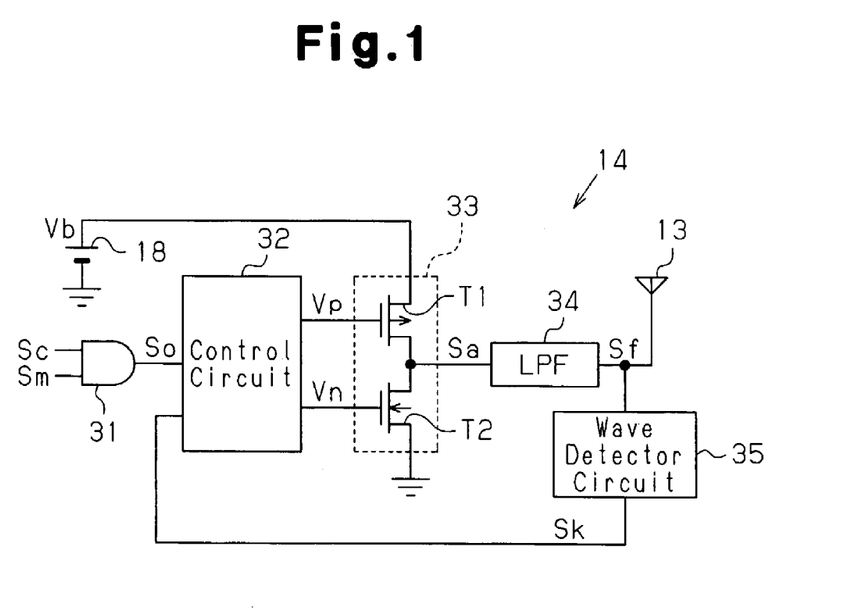
FIG. 1 is a block circuit diagram illustrating a transmitter portion according to a first embodiment of the present invention.

The transmitter portion 14 will now be described in detail with reference to FIG. 1. An antenna driving apparatus, which is the transmitter portion 14 in the first embodiment, includes a signal synthesizing circuit 31, a control circuit 32, an amplifier circuit, which is a driver circuit 33 in the first embodiment, a filter circuit 34, and a detection circuit, which is a wave detector circuit 35.

The signal synthesizing circuit 31 receives a carrier signal Sc and a code signal Sm. The carrier signal Sc is a signal supplied from an oscillator (not shown), which oscillates at a predetermined frequency (transmission frequency). The code signal Sm is a code signal for transmission request supplied from the control portion 16. The signal synthesizing circuit 31 synthesizes the carrier signal Sc and the code signal Sm to generate a transmission signal So. That is, the signal synthesizing circuit 31 superimposes the code signal Sm on the carrier signal Sc to generate the modulated transmission signal So.

The control circuit 32 receives the transmission signal So and a detection signal Sk from the wave detector circuit 35. Based on the transmission signal So, the control circuit 32 generates pulsed control signals Vp, Vn for controlling the driver circuit 33. Furthermore, the control circuit 32 varies the pulse width of the control signals Vp, Vn based on the voltage level of the detection signal Sk.

The driver circuit 33 is configured by two field-effect transistors (FET: hereinafter, simply referred to as transistors) T1, T2, which are serially connected in the first embodiment. The first transistor T1 is a P channel FET, and has a source, which receives a battery voltage Vb from the battery 18, a drain, which is connected to the second transistor T2, and a gate to which the first control signal Vp is applied. The second transistor T2 is an N channel FET, and has a source, which is connected to a ground GND, a drain, which is connected to the first transistor T1, and a gate to which the second control signal Vn is applied. The node of the first transistor T1 and the second transistor T2 is connected to the antenna 13 via the filter circuit 34.

The first transistor T1 is turned on and off in response to the first control signal Vp, and the second transistor T2 turns on and off in response to the second control signal Vn. Therefore, the driver circuit 33, which receives the battery voltage Vb, generates and outputs a pulsed signal Sa as the first and second transistors T1, T2 are turned on and off based on the associated control signals Vp, Vn, respectively.

The filter circuit 34 is, for example, a lowpass filter (LPF), which includes a coil and a capacitor, and removes a high frequency component from the signal Sa output from the driver circuit 33 and outputs a signal Sf. The signal Sf is transmitted from the antenna 13 as the request signal.

The wave detector circuit 35 is connected between the filter circuit 34 and the antenna 13. The wave detector circuit 35 is configured by, for example, a diode rectification circuit, and outputs the detection signal Sk having a voltage proportional to the level of the signal Sf (the level of the transmission power, that is, the level of the transmission output). As described above, the control circuit 32 varies the pulse width of the control signals Vp, Vn based on the voltage level of the detection signal Sk.

Figure 3:
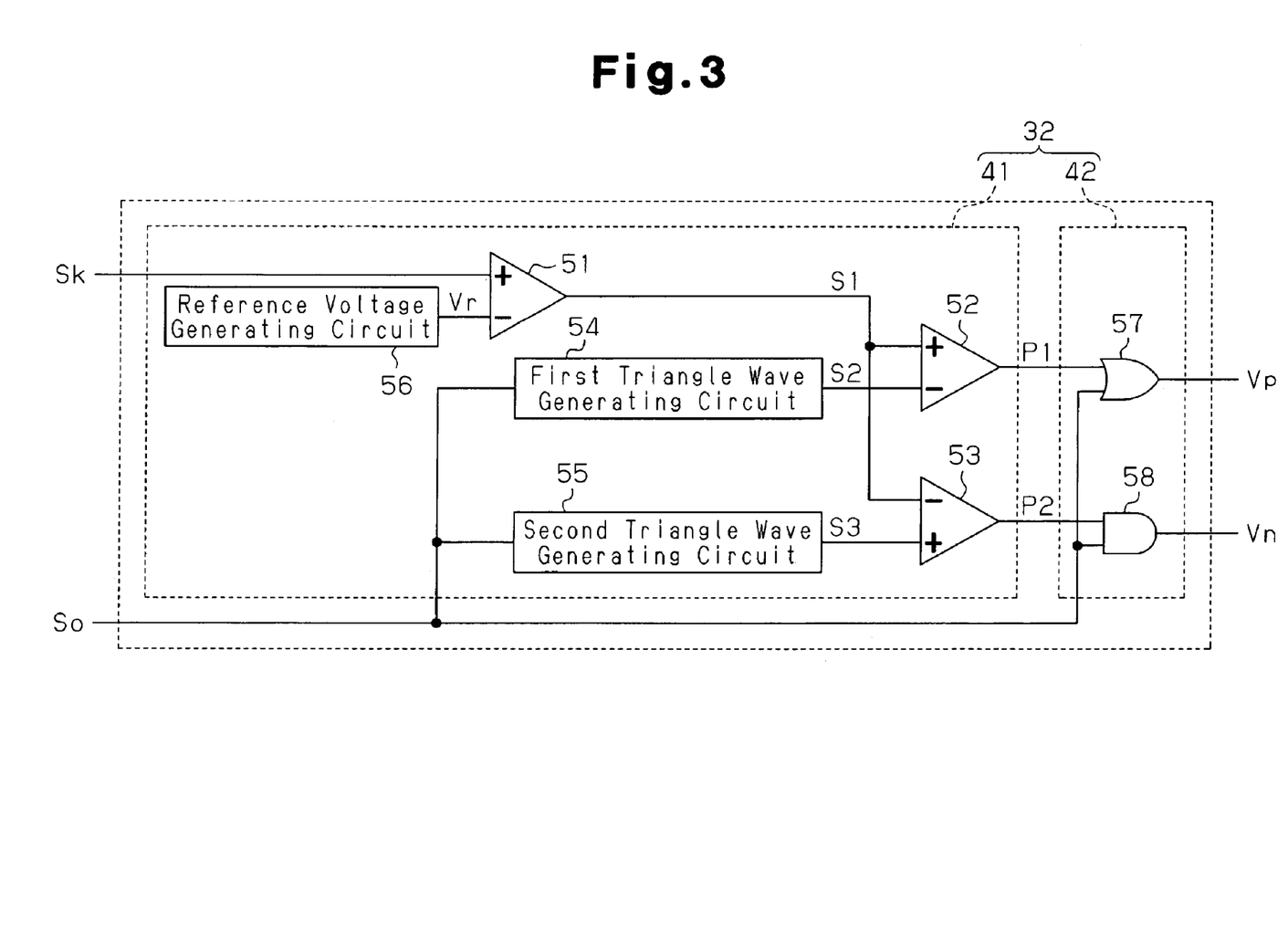
FIG. 3 is a circuit diagram illustrating the control circuit of the transmitter portion of FIG. 1.

As shown in FIG. 3, the control circuit 32 includes a pulse generating circuit 41 and a control signal generating circuit 42. The pulse generating circuit 41 generates pulse signals P1, P2 having a pulse width corresponding to the level of the detection signal Sk. The control signal generating circuit 42 generates control signals Vp, Vn in accordance with the pulse signals P1, P2 and the transmission signal So.

The pulse generating circuit 41 includes first to third comparators 51, 52, 53, first and second triangle wave generating circuits 54, 55, and a reference voltage generating circuit 56. The first comparator 51 has a non-inverting input terminal, which receives the detection signal Sk, and an inverting input terminal, which receives a reference voltage Vr from the reference voltage generating circuit 56. The reference voltage Vr is set in accordance with a response range of the portable device 11, that is, the range in which the request signal transmitted from the antenna 13 reaches. The first comparator 51 outputs a signal S1 corresponding to the difference between the voltage of the detection signal Sk and the reference voltage Vr.

Figure 4:
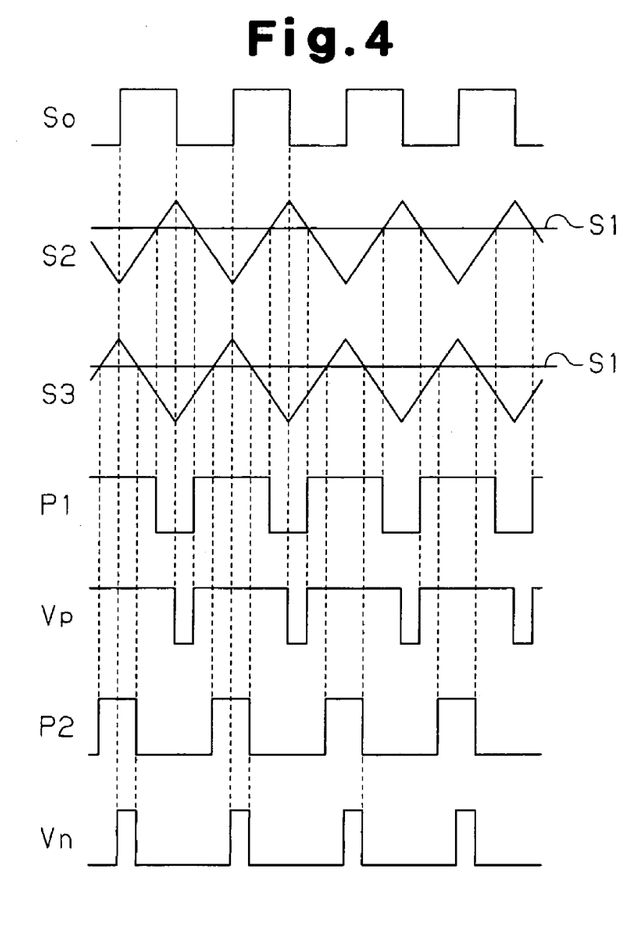
FIG. 4 is a diagram explaining operation of the control circuit of FIG. 3.

The triangle wave generating circuits 54, 55 generate triangle wave signals S2, S3, respectively, based on the transmission signal So. As shown in FIG. 4, the first triangle wave signal S2 has a maximum value at the falling edge of the transmission signal So, and has a minimum value at the rising edge of the transmission signal So. The second triangle wave signal S3 has a maximum value at the rising edge of the transmission signal So, and has a minimum value at the falling edge of the transmission signal So.

As shown in FIG. 3, the second comparator 52 has a non-inverting input terminal, which receives the output signal S1 from the first comparator 51, and an inverting input terminal, which receives the first triangle wave signal S2. The third comparator 53 has an inverting input terminal, which receives the output signal S1 from the first comparator 51, and a non-inverting input terminal, which receives the second triangle wave signal S3.

As shown in FIG. 4, the second comparator 52 compares the signal S1 sent from the first comparator 51 with the first triangle wave signal S2, and generates and outputs the pulse signal P1 having a level corresponding to the comparison result. In the first embodiment, when the level of the triangle wave signal S2 is greater than the level of the signal S1, the second comparator 52 generates the pulse signal P1 of a low level, and otherwise generates the pulse signal P1 of a high level. Therefore, the pulse width of the pulse signal P1 is varied in accordance with changes of the level of the signal S1, that is, changes of the voltage of the detection signal Sk, if there is any change.

The third comparator 53 compares the signal S1 with the second triangle wave signal S3, and generates the pulse signal P2 having a level corresponding to the comparison result. Therefore, the pulse width of the pulse signal P2 is varied in accordance with changes of the level of the signal S1, that is, changes of the voltage of the detection signal Sk, if there is any change.

The control signal generating circuit 42 includes an OR circuit 57 and an AND circuit 58. The OR circuit 57 receives the pulse signal P1 and the transmission signal So, and synthesizes the signals P1, So to generate the control signal Vp. The AND circuit 58 receives the pulse signal P2 and the transmission signal So, and synthesizes the signals P2, So to generate the control signal Vn.

Figure 5A:
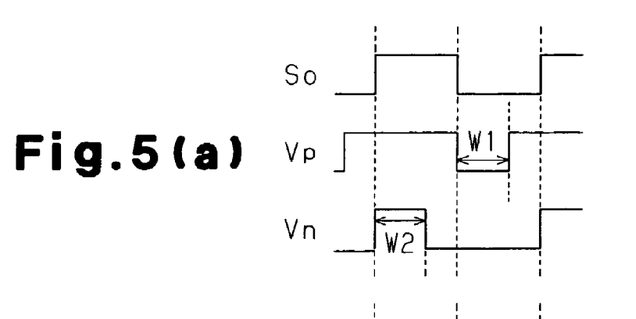
FIGS. 5(a) to 5(c) are diagrams explaining operation of the transmitter portion of FIG. 1.

Thus, as shown in FIG. 5(a), the control circuit 32 generates and outputs the first control signal Vp and the second control signal Vn based on the transmission signal So. Also, the control circuit 32 controls a low level pulse width W1 of the first control signal Vp and a high level pulse width W2 of the second control signal Vn in accordance with the voltage of the detection signal Sk. The first transistor T1 is turned on when the first control signal Vp is at a low level, and the second transistor T2 is turned on when the second control signal Vn is at a high level. Therefore, the control circuit 32 controls the pulse widths W1, W2 of the control signals Vp, VN that are of levels that turn on the associated transistors T1, T2 in accordance with the voltage of the detection signal Sk.

Figure 5B:
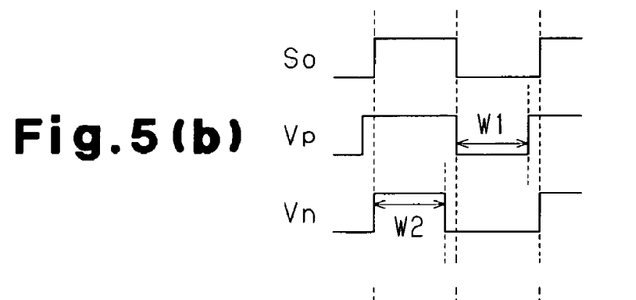
Figure 5C:
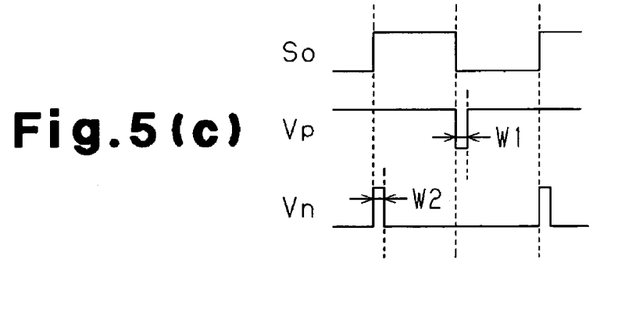

When the voltage of the detection signal Sk is lower than a predetermined voltage (reference voltage Vr), the control circuit 32 according to the first embodiment expands the pulse widths W1, W2 as shown in FIG. 5(b), and when the voltage of the detection signal Sk is higher than the predetermined voltage (reference voltage Vr), the control circuit 32 compresses the pulse widths W1, W2 as shown in FIG. 5(c). The pulse widths W1, W2 are expanded as the voltage of the detection signal Sk becomes lower than the reference voltage Vr, and the pulse widths W1, W2 are compressed as the voltage of the detection signal Sk becomes higher than the reference voltage Vr. The pulse widths W1, W2 of the control signals Vp, Vn, that is, the time period during which the transistors T1, T2 of the driver circuit 33 are turned on has an influence on the amount of the current supplied to the antenna 13, that is, the transmission power. As the time period during which the transistors T1, T2 are turned on is increased, the transmission power level is increased.

Therefore, if the time period during which the transistors T1, T2 are turned on (the pulse widths W1, W2) is shortened when the transmission power level is higher than a predetermined level, that is, when the voltage of the detection signal Sk is higher than the reference voltage Vr, the transmission power level is reduced. In contrast, if the time period during which the transistors T1, T2 are turned on (pulse width W1, W2) is increased when the transmission power level is lower than the predetermined level, that is, when the voltage of the detection signal Sk is less than the reference voltage Vr, the transmission power level is increased.

In this manner, by changing the pulse widths of the control signals Vp, Vn, which control the transistors T1, T2, in accordance with the voltage of the detection signal Sk, the control circuit 32 causes the voltage of the detection signal Sk to approach the reference voltage Vr, and maintains the voltage of the detection signal Sk constant, that is, maintains the transmission power level constant.

The above-mentioned first embodiment has the following advantages.

(1) The pulsed control signals Vp, Vn for controlling the driver circuit 33, which is supplied with the battery voltage Vb, are generated based on the transmission signal So, and the pulse widths W1, W2 of the control signals Vp, Vn are changed based on the output level of the driver circuit 33. As a result, the antenna 13 is driven at a constant transmission power level without reducing the battery voltage Vb, and thus the electric power consumption is reduced. Unlike the conventional technique, the apparatus is prevented from being enlarged since a circuit such as a regulator that reduces the battery voltage Vb is unnecessary.

(2) The pulse widths W1, W2 of the control signals Vp, Vn are changed in accordance with the detection signal Sk output from the wave detector circuit 35, which detects the output level of the driver circuit 33. As a result, the output level of the driver circuit 33 is stabilized.

(3) The voltage of the detection signal Sk output from the wave detector circuit 35 and the reference voltage Vr are compared with each other, and the pulse widths W1, W2 of the control signals Vp, Vn are controlled in accordance with the comparison result such that the voltage of the detection signal Sk agrees with the reference voltage Vr. As a result, the output level of the driver circuit 33 is maintained constant.

Second Embodiment

Next, a second embodiment of the present invention will now be described with reference to the drawings. The differences from the first embodiment will mainly be discussed below. The same reference numerals are given to those components that are the same as the corresponding components of the first embodiment.

Figure 7:
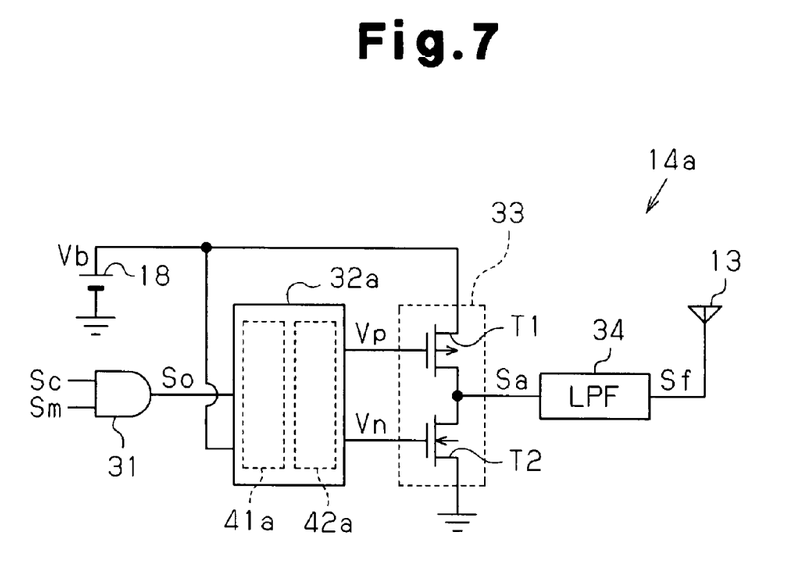
FIG. 7 is a block diagram illustrating a transmitter portion according to a second embodiment of the present invention.

FIG. 7 is a circuit diagram illustrating a transmitter portion 14a according to the second embodiment. The transmitter portion 14a replaces the transmitter portion 14 of FIG. 2. Therefore, a vehicle communication device of the second embodiment includes an antenna 13, which communicates with a portable device 11, the transmitter portion 14a, which generates a signal transmitted to the portable device 11, a receiving portion 15, which receives a signal transmitted from the portable device 11 via the antenna 13, and a control portion 16, which controls the transmitter portion 14a and the receiving portion 15.

The transmitter portion 14a includes a signal synthesizing circuit 31, a control circuit 32a, an amplifier circuit, which is a driver circuit 33 in the second embodiment, and a filter circuit 34.

The control circuit 32a receives a transmission signal So and a battery voltage Vb. Based on the transmission signal So, the control circuit 32 generates pulsed control signals Vp, Vn for controlling the driver circuit 33. Furthermore, the control circuit 32a changes the pulse widths of the control signals Vp, Vn based on the battery voltage Vb. For example, the control circuit 32a compares the battery voltage Vb with a predetermined reference voltage, which is lower than the battery voltage, and varies the pulse widths of the control signals Vp, Vn to change the time period during which the transistors T1, T2 are turned on in accordance with the difference between the battery voltage Vb and the reference voltage. That is, the control circuit 32a controls the pulse widths of the control signals Vp, Vn in accordance with the comparison result between the battery voltage Vb and the reference voltage such that the output level of the driver circuit 33 agrees with the reference voltage.

The control circuit 32a according to the second embodiment has a pulse generating circuit 41a, which generates a pulse signal having a pulse width corresponding to the battery voltage Vb, and a control signal generating circuit 42a, which generates the control signals Vp, Vn based on the pulse signal and the transmission signal So. The configurations of the pulse generating circuit 41a and the control signal generating circuit 42a are basically the same as those of the pulse generating circuit 41 and the control signal generating circuit 42 of the control circuit 32 of FIG. 3.

According to these configurations, even if the battery voltage Vb fluctuates, the control circuit 32a, by changing the pulse widths of the control signals Vp, Vn in accordance with the fluctuation of the battery voltage Vb, maintains the level of an output signal Sa of the driver circuit 33, that is, the level of a signal Sf supplied to the antenna 13 constant. Furthermore, unlike the first embodiment, since the second embodiment does not require the wave detector circuit 35, further miniaturization is achieved.

According to the above-mentioned second embodiment, the same advantages as the first embodiment are obtained, and further miniaturization is achieved since the wave detector circuit 35 is unnecessary.

Third Embodiment

Next, a third embodiment of the present invention will now be described with reference to the drawings. The differences from the first embodiment will mainly be discussed below. The same reference numerals are given to those components that are the same as the corresponding components of the first embodiment.

Figure 8:
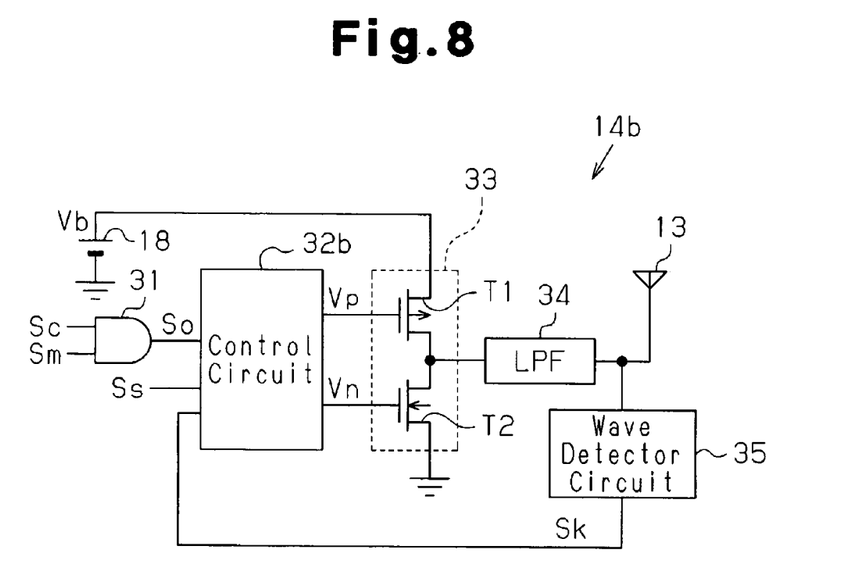
FIG. 8 is a block diagram illustrating a transmitter portion according to a third embodiment of the present invention.

FIG. 8 is a circuit diagram illustrating a transmitter portion 14b according to the third embodiment. The transmitter portion 14b replaces the transmitter portion 14 of FIG. 2. That is, a vehicle communication device of the third embodiment includes an antenna 13, which communicates with a portable device 11, the transmitter portion 14b, which generates a signal transmitted to the portable device 11, a receiving portion 15, which receives a signal transmitted from the portable device 11 via the antenna 13, a control portion 16, which controls the transmitter portion 14b and the receiving portion 15.

The transmitter portion 14b includes a signal synthesizing circuit 31, a control circuit 32b, an amplifier circuit, which is a driver circuit 33 in the third embodiment, a filter circuit 34, and a wave detector circuit 35.

The control circuit 32b receives a transmission signal So, a detection signal Sk, which is output from the wave detector circuit 35, and a selection signal Ss. The selection signal Ss is a signal for changing the antenna transmission output level, and is output from, for example, the control portion 16 shown in FIG. 2.

Figure 9:
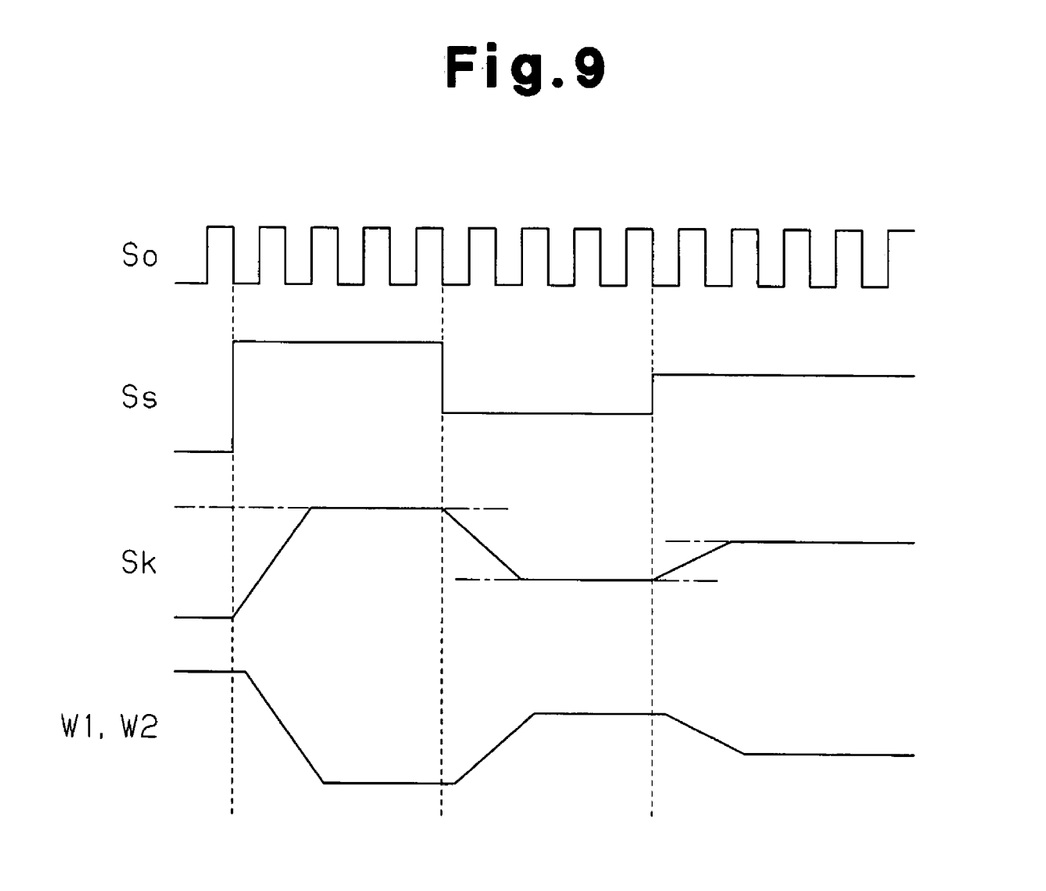
FIG. 9 is a diagram explaining operation of the transmitter portion of FIG. 8.

As shown in FIG. 9, the control circuit 32b compares the voltage of the selection signal Ss with the voltage of the detection signal Sk, and varies the pulse widths W1, W2 of control signals Vp, Vn for controlling the transistors T1, T2 in accordance with the comparison result. Accordingly, the control circuit 32b makes the voltage of the detection signal Sk close to the voltage of the selection signal Ss, thus maintaining the voltage of the detection signal Sk constant. Also, when the voltage of the selection signal Ss is changed, the control circuit 32b makes the voltage of the detection signal Sk close to the changed voltage of the selection signal Ss, that is, changes the transmission power level. With this configuration, the response range of the portable device 11 shown in FIG. 2 (the range in which the request signal reaches) is changed in accordance with the voltage of the selection signal Ss. That is, the third embodiment is substantially the same as the first embodiment except that the reference voltage Vr in the first embodiment is variable.

Making the response range of the portable device 11 variable brings about various benefits. For example, the response range of the portable device 11 may be expanded. In this case, for example, direction indicator lamps of the vehicle may be caused to blink to inform the user of the position of the vehicle when the user holding the portable device 11 is at a distance. Also, the response range of the portable device 11 may be reduced. In this case, the door lock may be unlocked when the user is in the response range. In this manner, convenience of the user in using the vehicle is improved.

According to the third embodiment, in addition to the advantages of the first embodiment, the output level of the driver circuit 33 is maintained constant at a level corresponding to the voltage of the selection signal Ss by comparing the voltage of the variable selection signal Ss with the detection signal Sk, which is output from the wave detector circuit 35. Since the voltage of the selection signal Ss is variable, the transmission output level can be changed as required to change the range in which the request signal reaches in accordance with the condition.

The above embodiments may be modified as follows.

The configuration of the control circuit 32 according to the first embodiment is merely an example, and the pulse widths of the control signals Vp, Vn may be changed by other configuration.

In each of the first and third embodiment, the wave detector circuit 35 is connected between the filter circuit 34 and the antenna 13. However, as long as the level of the request signal (transmission output level) is detected, the wave detector circuit 35 may be connected at any position. For example, the wave detector circuit 35 may be connected between the driver circuit 33 and the filter circuit 34 or to the filter circuit 34 itself.

In each of the above embodiments, the driver circuit 33 is configured by the P channel transistor T1 and the N channel transistor T2, but the configuration of the driver circuit 33 may be changed as required. For example, the driver circuit 33 may be configured by only the N channel transistor, only the P channel transistor, or using a bipolar transistor.

In the third embodiment, by changing the voltage of the selection signal Ss supplied to the control circuit 32b, the pulse widths of the control signals Vp, Vn, that is, the transmission output level of the request signal is changed. However, a reference voltage generating circuit, which generates reference voltages that are different from one another, may be provided in the control circuit 32b, and the reference voltages output from the reference voltage generating circuit may be selected in accordance with the selection signal supplied from the outside. Furthermore, a circuit that changes the reference voltage in accordance with the selection signal supplied from the outside may be provided in the control circuit 32b.

In each of the above embodiments, the present invention is embodied in the electronic key system 10, which controls the door lock portion 17 of the vehicle, but may be embodied in a system that controls, for example, an engine or a sound system as a controlled portion (controlled object).

The invention claimed is:

1. An antenna driving apparatus operated by power supplied from a power source and generates a signal transmitted via an antenna, the antenna driving apparatus comprising:
   a control circuit, which generates a pulsed control signal based on a pulsed transmission signal; and
   an amplifier circuit, which is supplied with power from the power source and generates an output signal to be sent to the antenna based on the control signal,
   wherein the control circuit changes the pulse width of the control signal based on the level of the output signal or the voltage of the power source, and wherein the control circuit includes:
   a pulse generating circuit which generates a pulse signal having a pulse width corresponding to the level of the output signal or the voltage of the power source; and
   a control signal generating circuit which synthesizes the pulse signal and the pulsed transmission signal to generate the control signal having the pulse width corresponding to the level of the output signal or the voltage of the power source.

2. The antenna driving apparatus according to claim 1, further comprising a detection circuit, which detects the level of the output signal of the amplifier circuit, and the control circuit changes the pulse width of the control signal in accordance with the level of a detection signal output from the detection circuit.

3. The antenna driving apparatus according to claim 2, wherein the control circuit compares the voltage of the detection signal with a predetermined reference voltage and controls the pulse width of the control signal in accordance with the comparison result such that the voltage of the detection signal agrees with the reference voltage.

4. The antenna driving apparatus according to claim 3, wherein the reference voltage is variable.

5. The antenna driving apparatus according to claim 2, wherein the pulse generating circuit generates the pulse signal having the pulse width corresponding to the level of the detection signal.

6. The antenna driving apparatus according to claim 1, wherein the control circuit compares the voltage of the power source with a predetermined reference voltage and controls the pulse width of the control signal in accordance with the comparison result such that the voltage of the output signal of the amplifier circuit agrees with the reference voltage.

7. The antenna driving apparatus according to claim 1, wherein the antenna is accommodated in a handle arranged on the outside of a vehicle door.

8. The antenna driving apparatus according to claim 1, further comprising a synthesizing circuit that synthesizes a carrier signal and a code signal to generate the transmission signal.

9. The antenna driving apparatus according to claim 3, wherein the pulse generating circuit includes:
   a first comparison circuit which outputs a comparison signal corresponding to the difference between the voltage of the detection signal and the reference voltage;
   a triangle wave generating circuit which generates a triangle wave signal based on the transmission signal; and
   a second comparison circuit which compares the comparison signal with the triangle wave signal and generates the pulse signal based on the comparison result.

10. The antenna driving apparatus according to claim 6, wherein the pulse generating circuit includes:
   a first comparison circuit which outputs a comparison signal corresponding to the difference between the voltage of the power source and the reference voltage;
   a triangle wave generating circuit which generates a triangle wave signal based on the transmission signal; and
   a second comparison circuit which compares the comparison signal with the triangle wave signal and generates the pulse signal based on the comparison result.

* * * * *